(12) United States Patent
Lee

(10) Patent No.: US 11,453,201 B2
(45) Date of Patent: Sep. 27, 2022

(54) WINDOW GLASS AND ELECTRONIC DEVICE INCLUDING THE SAME

(71) Applicant: Samsung Electronics Co., Ltd., Suwon-si (KR)

(72) Inventor: Hyunggon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 118 days.

(21) Appl. No.: 16/967,278

(22) PCT Filed: Feb. 14, 2019

(86) PCT No.: PCT/KR2019/001830
§ 371 (c)(1),
(2) Date: Aug. 4, 2020

(87) PCT Pub. No.: WO2019/160358
PCT Pub. Date: Aug. 22, 2019

(65) Prior Publication Data
US 2021/0078286 A1    Mar. 18, 2021

(30) Foreign Application Priority Data
Feb. 14, 2018  (KR) .......................... 10-2018-0018565

(51) Int. Cl.
*G06F 3/041* (2006.01)
*B32B 7/12* (2006.01)
(Continued)

(52) U.S. Cl.
CPC ................ *B32B 7/12* (2013.01); *B32B 7/023* (2019.01); *B32B 17/10* (2013.01); *B32B 27/36* (2013.01);
(Continued)

(58) Field of Classification Search
CPC ........... B32B 7/12; B32B 7/023; B32B 17/10; B32B 27/36; B32B 2307/41;
(Continued)

(56) References Cited

U.S. PATENT DOCUMENTS 9,835,913 B2   12/2017  Pellerite et al.
10,018,754 B2   7/2018  Matsuo et al.
(Continued)

FOREIGN PATENT DOCUMENTS

JP  2014-213600 A  11/2014
JP  6138363 B2  5/2017
(Continued)

OTHER PUBLICATIONS

European Search Report dated Apr. 22, 2021, issued in European Application No. 19753838.2.
(Continued)

*Primary Examiner* — Thuy N Pardo
(74) *Attorney, Agent, or Firm* — Jefferson IP Law, LLP

(57) ABSTRACT

A window glass is disclosed. The window glass is divided into a transparent area and an opaque area formed to surround at least part of the transparent area. The window glass includes a transparent layer and an opaque layer that forms the opaque area by being stacked on a partial area of the transparent layer to correspond to the opaque area. The transparent layer includes a protective glass that forms a first surface of the window glass, a first transparent layer formed of a material that is hardened by irradiation of UV light, the first transparent layer including a pattern portion having a pattern formed on an area corresponding to the opaque area, and a second transparent layer formed of an optically isotropic material and formed between the protective glass and the first transparent layer. The opaque layer is formed on the pattern portion of the window glass.

17 Claims, 9 Drawing Sheets

(51) Int. Cl.
  *B32B 7/023*  (2019.01)
  *B32B 27/36*  (2006.01)
  *B32B 17/10*  (2006.01)
  *G06V 40/13*  (2022.01)
  *H01L 27/32*  (2006.01)
  *H05K 9/00*   (2006.01)

(52) U.S. Cl.
  CPC .......... *G06F 3/0412* (2013.01); *G06F 3/0416* (2013.01); *G06V 40/13* (2022.01); *B32B 2307/41* (2013.01); *B32B 2307/412* (2013.01); *B32B 2457/206* (2013.01); *B32B 2457/208* (2013.01); *H01L 27/323* (2013.01); *H05K 9/0081* (2013.01)

(58) Field of Classification Search
  CPC ........ B32B 2307/412; B32B 2457/206; B32B 2457/208; B32B 37/12; B32B 2307/4023; B32B 27/308; B32B 27/365; B32B 2250/02; B32B 2255/10; B32B 2255/20; B32B 2255/205; B32B 2255/26; B32B 2255/28; B32B 2307/708; G06F 3/0412; G06F 3/0416; G06F 1/1626; G06F 1/1637; G06F 1/1643; G06F 3/041; G06V 40/13; G06V 40/1318; H01L 27/323; H05K 9/0081; H04M 1/0266; H04M 1/026; H04M 2250/12; H04M 2250/22
  USPC ..... 345/173, 174, 166, 175; 250/206, 338.1; 349/12
  See application file for complete search history.

(56) References Cited

U.S. PATENT DOCUMENTS

| | | | |
|---|---|---|---|
| 10,101,617 B2 | 10/2018 | Pellerite et al. | |
| 10,222,521 B2 | 3/2019 | Matsuo et al. | |
| 11,204,628 B2* | 12/2021 | Paek | H01L 51/5253 |
| 2009/0262085 A1* | 10/2009 | Wassingbo | G06F 3/04886 |
| | | | 345/173 |
| 2011/0109590 A1* | 5/2011 | Park | G06F 3/044 |
| | | | 345/174 |
| 2013/0223016 A1 | 8/2013 | Kim et al. | |
| 2014/0078412 A1* | 3/2014 | Franklin | C03C 21/002 |
| | | | 349/12 |
| 2014/0191110 A1* | 7/2014 | Holenarsipur | G06F 3/0412 |
| | | | 250/206 |
| 2014/0217059 A1* | 8/2014 | Park | H05K 3/06 |
| | | | 216/13 |
| 2015/0202853 A1* | 7/2015 | Hwang | B32B 37/12 |
| | | | 156/247 |
| 2015/0212626 A1 | 7/2015 | Kim et al. | |
| 2015/0276976 A1* | 10/2015 | Holenarsipur | G06F 1/169 |
| | | | 250/338.1 |
| 2016/0091928 A1* | 3/2016 | Huang | B32B 7/12 |
| | | | 156/60 |
| 2016/0124565 A1 | 5/2016 | Kim | |
| 2016/0255735 A1* | 9/2016 | Han | G06F 1/1647 |
| | | | 359/894 |
| 2016/0306080 A1* | 10/2016 | Boyd | G02F 1/01 |
| 2017/0200914 A1 | 7/2017 | Min | |
| 2017/0357350 A1* | 12/2017 | Matsuyuki | C03C 17/3639 |
| 2017/0364172 A1 | 12/2017 | Kim et al. | |
| 2018/0039815 A1 | 2/2018 | Jung et al. | |
| 2018/0129798 A1* | 5/2018 | He | G06V 10/141 |
| 2018/0217429 A1* | 8/2018 | Busch | G02F 1/076 |
| 2018/0260055 A1 | 9/2018 | Kim et al. | |
| 2019/0377858 A1* | 12/2019 | He | G06V 40/1365 |
| 2020/0092408 A1* | 3/2020 | Moon | H04M 1/0202 |
| 2020/0145624 A1* | 5/2020 | Jeong | H04N 9/30 |
| 2020/0361179 A1* | 11/2020 | Schuch | B32B 15/08 |
| 2020/0375045 A1* | 11/2020 | Prest | H04M 1/0249 |

FOREIGN PATENT DOCUMENTS

| | | |
|---|---|---|
| KR | 10-2010-0053169 A | 5/2010 |
| KR | 10-1350424 B1 | 1/2014 |
| KR | 10-2016-0005405 A | 1/2016 |
| KR | 10-2017-0061015 A | 6/2017 |
| KR | 10-2017-0084403 A | 7/2017 |
| KR | 10-2017-0143398 A | 12/2017 |
| KR | 10-2018-0005833 A | 1/2018 |
| KR | 10-2018-0015371 A | 2/2018 |
| TW | I588026 B | 6/2017 |

OTHER PUBLICATIONS

Indian Office Action dated Feb. 11, 2022, issued in Indian Patent Application No. 202017034891.

\* cited by examiner (a)

(b)

(c)

(d)

(e)

WINDOW GLASS AND ELECTRONIC DEVICE INCLUDING THE SAME

CROSS-REFERENCE TO RELATED APPLICATION(S)

This application is a U.S. National Stage application under 35 U.S.C. § 371 of an International application number PCT/KR2019/001830, filed on Feb. 14, 2019, which is based on and claims priority of a Korean patent application number 10-2018-0018565, filed on Feb. 14, 2018, in the Korean Intellectual Property Office, the disclosure of which is incorporated by reference herein in its entirety.

TECHNICAL FIELD

The disclosure relates to a window glass and an electronic device including the same.

BACKGROUND ART

A window glass applied to a surface of a display is made of a polyethene terephthalate (PET) sheet, which is a kind of plastic, or is made of reinforced glass. A bezel area is formed at the periphery of the window glass to protect the display from shock or form an aesthetic sense.

A bezel area of a conventional window glass is formed to be flat. Accordingly, the bezel area may be implemented by a printing method. A bezel area of a recent window glass including a curved surface may be implemented by a pad printing method or lamination of an optical adhesive film.

Meanwhile, a fingerprint sensor of an electronic device, such as a smartphone, is generally located in a bezel area of a window glass. However, a fingerprint sensor of a recent electronic device is located on a rear surface portion of the device so as to expand a front display.

DISCLOSURE

Technical Problem

In a case of implementing a bezel by a conventional pad printing method, only monochrome printing is possible and metal texture or reflection characteristics through formation of a pattern cannot be implemented. Therefore, there is a problem of poor workability.

Furthermore, in a case of laminating a base film made of PET on a window glass by using an optical clear adhesive (OCA), a pattern may be formed on a bezel area of the base film, and thus it is advantageous in terms of workability. However, in this case, optical isotropy of the window glass cannot be ensured due to the PET film, and therefore it is difficult to drive an optical sensor formed under a display area.

In addition, chemical and/or physical isotropy of the window glass cannot be ensured due to the PET film, and therefore it is difficult to drive the sensor formed under the display area.

Technical Solution

According to an aspect, provided is a window glass that is divided into a transparent area and an opaque area formed to surround at least part of the transparent area and includes a transparent layer and an opaque layer that forms the opaque area by being stacked on a partial area of the transparent layer to correspond to the opaque area. The transparent layer includes a protective glass that forms a first surface of the window glass, a first transparent layer formed of a material that is hardened by irradiation of ultraviolet (UV) light, the first transparent layer including a pattern portion having a pattern formed on an area corresponding to the opaque area, and a second transparent layer formed of an optically isotropic material and formed between the protective glass and the first transparent layer. The opaque layer is formed on the pattern portion, and part of the first transparent layer and the opaque layer form a second surface of the window glass.

Furthermore, provided is a window glass that includes a transparent layer including a protective glass that forms a first surface of the window glass, a first transparent layer formed of a material that is hardened by irradiation of UV light, and a second transparent layer formed of an optically isotropic material and formed between the protective glass and the first transparent layer, and an opaque layer formed on a partial area of the first transparent layer. The remaining area of the first transparent layer and the opaque layer form a second surface of the window glass.

According to another aspect, provided is an electronic device that includes a housing, a window glass formed on at least a first surface of the housing, a touch screen panel disposed in the housing and disposed under the window glass, a fingerprint sensor disposed in the housing and disposed in a position corresponding to a partial area of the touch screen panel, and at least one processor disposed in the housing. The window glass includes a transparent layer that includes a protective glass that forms a first surface of the window glass, a first transparent layer formed of a material that is hardened by irradiation of UV light, and a second transparent layer formed of an optically isotropic material and formed between the protective glass and the first transparent layer, and an opaque layer formed on a partial area of the first transparent layer. The remaining area of the first transparent layer and the opaque layer form a second surface of the window glass. The at least one processor controls the touch screen panel and the fingerprint sensor such that light emitted from the touch screen panel passes through the second transparent layer of the window glass and is collected through the fingerprint sensor.

Advantageous Affects

According to exemplary embodiments, the window glass may have optical isotropy and may reduce the thickness of an electronic device by 50% or more, compared to a conventional window glass including a PET film. Furthermore, a sensor located under the transparent area of the window glass may be smoothly driven.

Moreover, the window glass may have physical and/or chemical isotropy, and thus a physically and/or chemically driven sensor disposed under the transparent area may be smoothly driven.

In addition, various patterns and/or colors may be formed although the window glass does not include a PET film.

MODE FOR INVENTION

Figure 1:
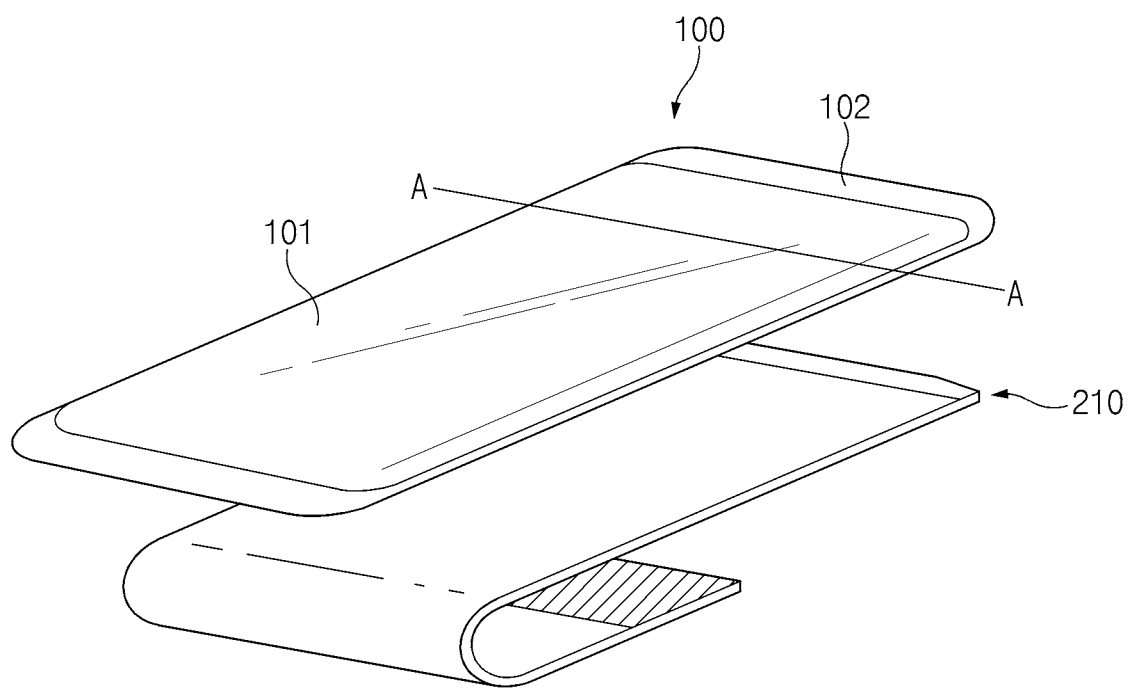
FIG. 1 is a perspective view of a window glass according to an embodiment.

FIG. 1 is a perspective view of a window glass 100 according to an embodiment.

The window glass 100 according to an embodiment may be disposed on a surface of an electronic device or a display device. In particular, the window glass may be applied to a mobile device or a display for a mobile device. The display may have various display panels such as a liquid crystal display (LCD), a light emitting diode (LED), or a plasma display panel (PDP).

The window glass 100 may be divided into a transparent area 101 through which light can pass and an opaque area 102 through which light cannot pass.

A touch screen panel 210 may be disposed under the transparent area 101. The touch screen panel 210 may include a pixel array. Light emitted from the pixel array may pass through the transparent area 101 of the window glass to represent a screen. In general, the touch screen panel 210 may include a touch sensor layer and may have a touch function. However, the touch screen panel 210 is not limited thereto. The window glass 100 according to an embodiment may also be disposed on a surface of a display device or an electronic device that has no touch function.

The opaque area 102, as illustrated in FIG. 1, may be formed at the periphery of the transparent area 101 to surround the transparent area 101. The opaque area 102 may be referred to as a bezel or a bezel area. The opaque area 102 may be formed to surround all or part of the periphery of the transparent area 101.

The opaque area 102 may be formed to have a color and/or a pattern that causes an aesthetic sense.

As illustrated in FIG. 1, the transparent area 101 may be formed such that a partial area thereof is curved. The transparent area 101 may be formed to correspond to the shape of the touch screen panel 210 or the display panel that is disposed under the transparent area 101.

Figure 2:
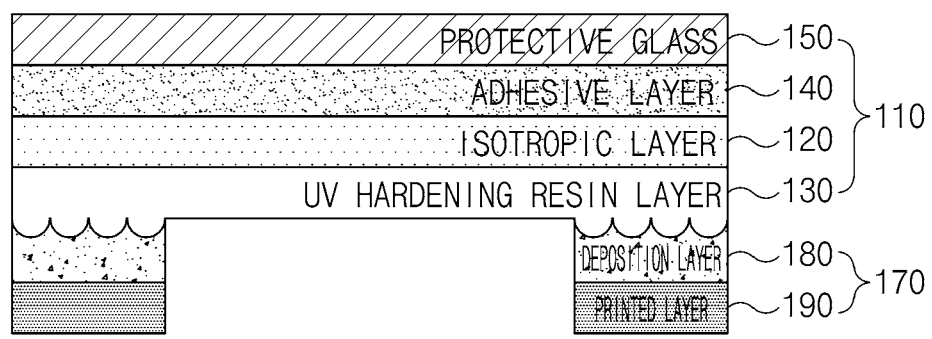
FIG. 2 is a sectional view illustrating a section taken along line A-A' of FIG. 1.

FIG. 2 is a sectional view illustrating a section taken along line A-A' of FIG. 1.

Referring to FIG. 2, the window glass 100 according to an embodiment may include a transparent layer 110 and an opaque layer 170.

The transparent area 101 and the opaque area 102 described above are distinguished from each other based on the surface of the window glass 100. Meanwhile, the transparent layer 110 and the opaque layer 170 illustrated in FIG. 2 constitute a section of the window glass.

In an embodiment, the transparent layer 110 may include an isotropic layer 120, a protective glass 150 formed on one surface of the isotropic layer 120, a UV hardening resin layer 130 formed on an opposite surface of the isotropic layer 120, and an adhesive layer 140 for bonding the isotropic layer 120 and the protective glass 150.

Based on FIG. 2, in the following description, a direction in which the protective glass 150 is formed is referred to as an upper side, and a direction in which a deposition layer 180 and a printed layer 190 are formed is referred to as a lower side.

In various embodiments, the isotropic layer may include at least one of an optically isotropic layer, a physically isotropic layer, and a chemically isotropic layer.

Light may pass through the optically isotropic layer, and the refractivity may be constant irrespective of the direction of the passing light. This characteristic may improve the applicability of a sensor that uses light as a signal. For example, in a case where an optical fingerprint sensor is located under the transparent layer 110 and the transparent layer 110 is optically anisotropic, the refractivity of light reflected from a fingerprint may vary depending on the direction of the light. Therefore, the optical fingerprint sensor cannot accurately receive light.

To ensure optical isotropy, the isotropic layer 120 does not contain polyethylene terephthalate (PET). In a case where the isotropic layer 120 contains a PET material, it is easy to print a pattern or a color on the bezel. However, accurate operation of the fingerprint sensor is impossible because the transparent area has optical anisotropy.

To print the opaque area 102, such as the bezel, while maintaining optical isotropy, the isotropic layer 120 according to an embodiment may include a primer layer. The primer layer may contain acrylic acrylate and urethane acrylate as a composite material of a hard material and a soft material.

The primer layer may be formed on the adhesive layer 140. The primer layer may be formed by a thermal-hardening process, and thus coupling reliability for the protective glass 150 may be improved. The primer layer may be formed on the adhesive layer 140 by micro gravure coating or air-knife coating.

The primer layer may contain acrylic acrylate and urethane acrylate. The acrylic acrylate and the urethane acrylate may be formed at appropriate composition ratios. For example, the acrylic acrylate component may facilitate forming an opaque area of the primer layer. That is, an ink for printing or a resin for a pattern may be easily attached to the primer layer. Meanwhile, the urethane acrylate is a material having elasticity and has crack resistance. The urethane acrylate component may provide sufficient flexibility when the window glass and the protective glass 150 are coupled. The composition ratios of the acrylic acrylate and the urethane acrylate of the primer layer may vary depending on an electronic device or a display in which the window glass 100 is used.

For example, the primer layer may have a transmittance of 99% or more, a haze of 0.3% or less, and a contact angle of 60 degrees to 70 degrees.

Furthermore, to ensure optical isotropy, the isotropic layer 120 may be formed of isotropic polycarbonate, in addition to the primer layer. The isotropic polycarbonate may be excellent in optical characteristics such as transmittance and haze, compared to PET and may have optical isotropy.

The UV hardening resin layer 130 may be formed under the isotropic layer 120 and may be formed to be transparent to allow light to pass. The UV hardening resin layer 130 may be formed of a material that is hardened when UV light is irradiated. The UV hardening resin layer may be formed of a liquid coating solution that is hardened when UV light is irradiated. The liquid coating solution may be referred to as a UV resin. The UV hardening resin layer 130 may include an oligomer as a base material, a monomer as a reactive thinner, and a photopolymerization initiator that initiates polymerization by generating radicals or cat ions by absorbing UV light. The oligomer may be formed of at least one of a polyester-based material, an epoxy-based material, a polyether-based material, or a polyarylate-based material.

Referring to FIG. 2, the UV hardening resin layer 130 may include a pattern portion 132 including a pattern formed on a lower surface of the UV hardening resin layer.

The pattern may be formed on the UV hardening resin layer by transferring a predetermined pattern on the liquid coating solution and thereafter hardening the liquid coating solution by irradiating UV light. The pattern formed on the UV hardening resin layer 130 may be exposed to the surface of the window glass 100 through the isotropic layer 120 and the protective glass 150. The pattern may be formed by using a mold and may provide an aesthetic sense to the surface of the window glass 100.

The adhesive layer 140 may be formed between the isotropic layer 120 and the protective glass 150 to bond an upper surface of the isotropic layer 120 and a lower surface of the protective glass 150.

The adhesive layer 140 may be formed of an optical clear adhesive (OCA) or a pressure sensitive adhesive (PSA) that is a transparent material. As described above, the primer layer may be formed on the adhesive layer 140 by the thermal-hardening process.

The protective glass 150 may be located over the isotropic layer 120 and may be laminated on the isotropic layer 120 by the adhesive layer 140.

In an embodiment, the opaque layer 170 may include the deposition layer 180 formed on the pattern portion 132 and the printed layer 190 formed on the deposition layer 180.

To represent a color that cannot be represented by only a color ink, the deposition layer 180 may include a plurality of layers formed of various materials. The deposition layer may be formed such that the opaque area has metal texture and reflection characteristics.

The plurality of layers of the opaque layer may be formed to have different thicknesses or may contain different materials.

The deposition layer 180 may include a metal layer. The metal layer may contain metal or a metal compound and may represent metal texture. Furthermore, the metal layer may contain oxide. The metal may include indium (In), and the oxide may include titanium dioxide (TiO2) (or, silicon dioxide (SiO2) or aluminum oxide (Al2O3)).

The metal layer may be formed by thermally depositing the metal, the metal compound, or the oxide on the pattern portion 132 of the UV hardening resin layer 130. The metal layer may be formed of a plurality of layers by repeating a deposition process a plurality of times.

The printed layer 190 may form a color exposed to the surface of the window glass 100. Likewise to the metal layer, the printed layer 190 may include a plurality of layers. For example, the printed layer 190 may include a colored layer printed with a color ink and a black layer printed with a black ink. Based on FIG. 2, the colored layer may be located on the upper side, and the black layer may be located on the lower side. Alternatively, the printed layer may include only the black layer, which is printed with the black ink, without the colored layer.

Figure 3:
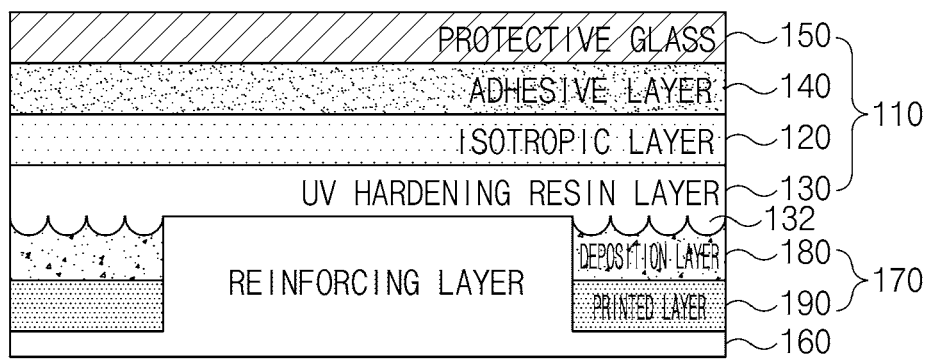
FIG. 3 is a sectional view illustrating another embodiment of the section taken along line A-A' of FIG. 1.

FIG. 3 is a sectional view illustrating another embodiment of the section taken along line A-A' of FIG. 1.

Comparing FIG. 2 and FIG. 3, the window glass 100 according to an embodiment may further include a reinforcing layer 160.

The reinforcing layer 160 may be formed to cover lower surfaces of the transparent layer 110 and the opaque layer 170. The reinforcing layer 160 may be formed of the same material as the UV hardening resin layer 130 described above. A liquid coating solution that is hardened by irradiation of UV light may be applied to the lower surface of the printed layer 190 and the lower surface of the UV hardening resin layer 130. Thereafter, when UV light is irradiated to the liquid coating solution, the protective glass 150 may be formed.

As the reinforcing layer 160 formed of a transparent material is inserted into a recess formed between the opaque areas 102, the reinforcing layer may prevent, in advance, damage that is likely to occur in a manufacturing process while maintaining the transparent area 101 and may improve product reliability.

The window glass 100 according to an embodiment may include the transparent layer 110 having optical isotropy, and thus the transparent area 101 may have isotropy. Accordingly, the touch screen panel 210 or an optical sensor formed under the touch screen panel 210 may accurately receive light irrespective of the direction of light passing through the transparent area 101.

For example, in a case where a biometric sensor, such as a fingerprint sensor capable of receiving light, is located under the touch screen panel 210, the fingerprint sensor cannot accurately recognize light passing through the transparent area 101 because a conventional PET film has optical anisotropy. In contrast, because the window glass 100 according to an embodiment has optical isotropy, the fingerprint sensor can accurately receive light passing through the transparent area 101.

Furthermore, the window glass 100 according to an embodiment may include the UV hardening resin layer 130 and may have an effect that a pattern is easily formed.

In addition, the window glass 100 according to an embodiment may further include the UV hardening reinforcing layer 160 as another embodiment, and thus the printed layer 190 may be firmly formed. Accordingly, product reliability may be ensured.

Figure 4:
FIG. 4 is a view sequentially illustrating a manufacturing method of the window glass illustrated in FIG. 2.
Figure 4:
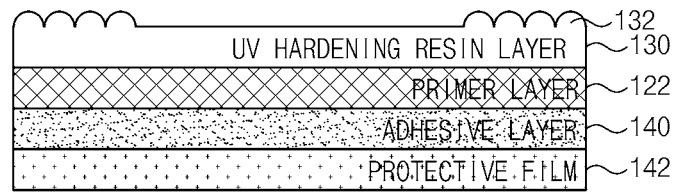
Figure 4:
Figure 4:
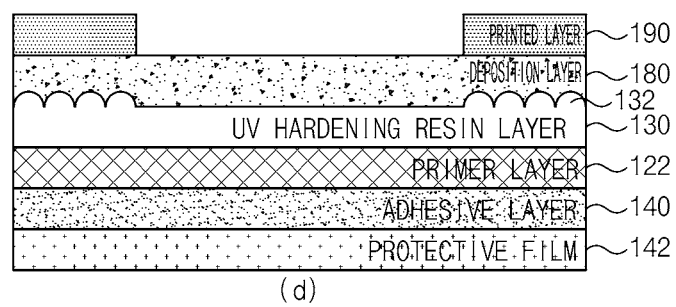
Figure 4:
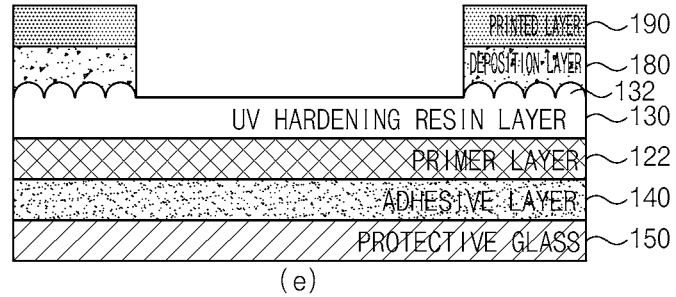
Figure 5:
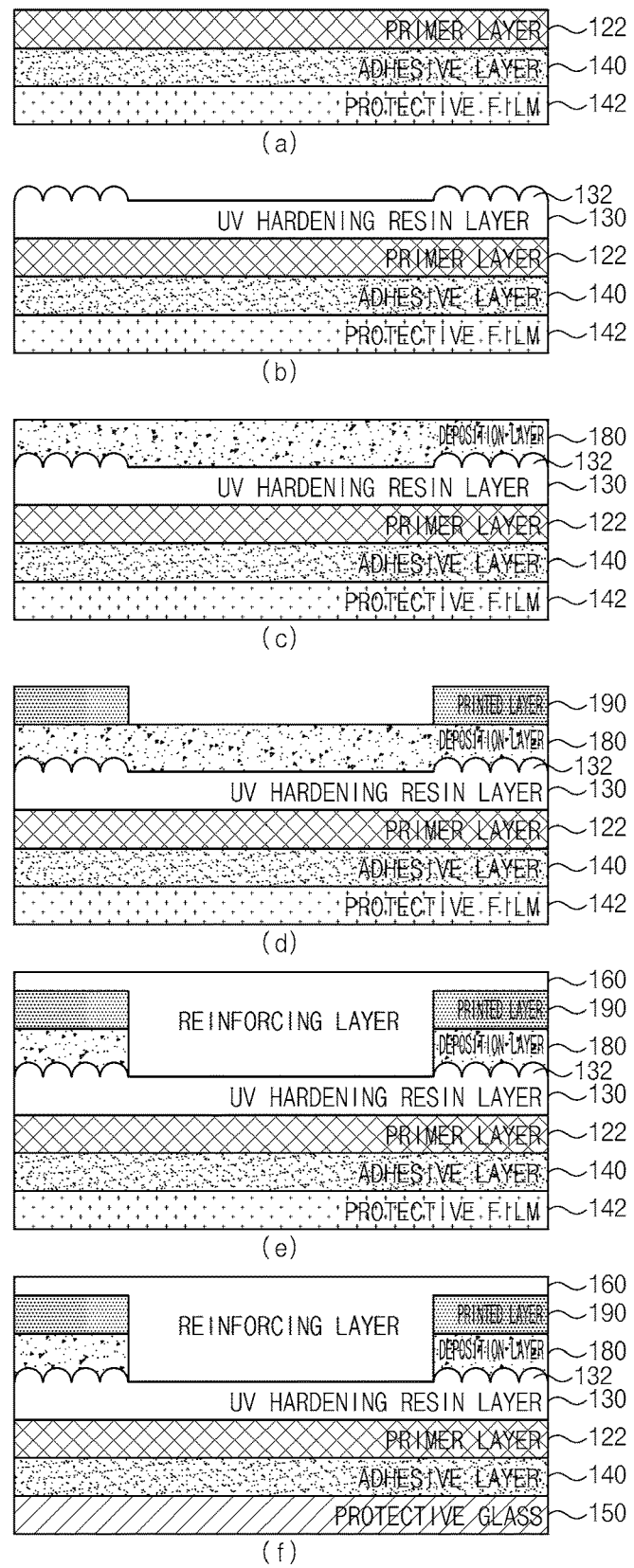
FIG. 5 is a view sequentially illustrating a manufacturing method of the window glass illustrated in FIG. 3.
Figure 6:
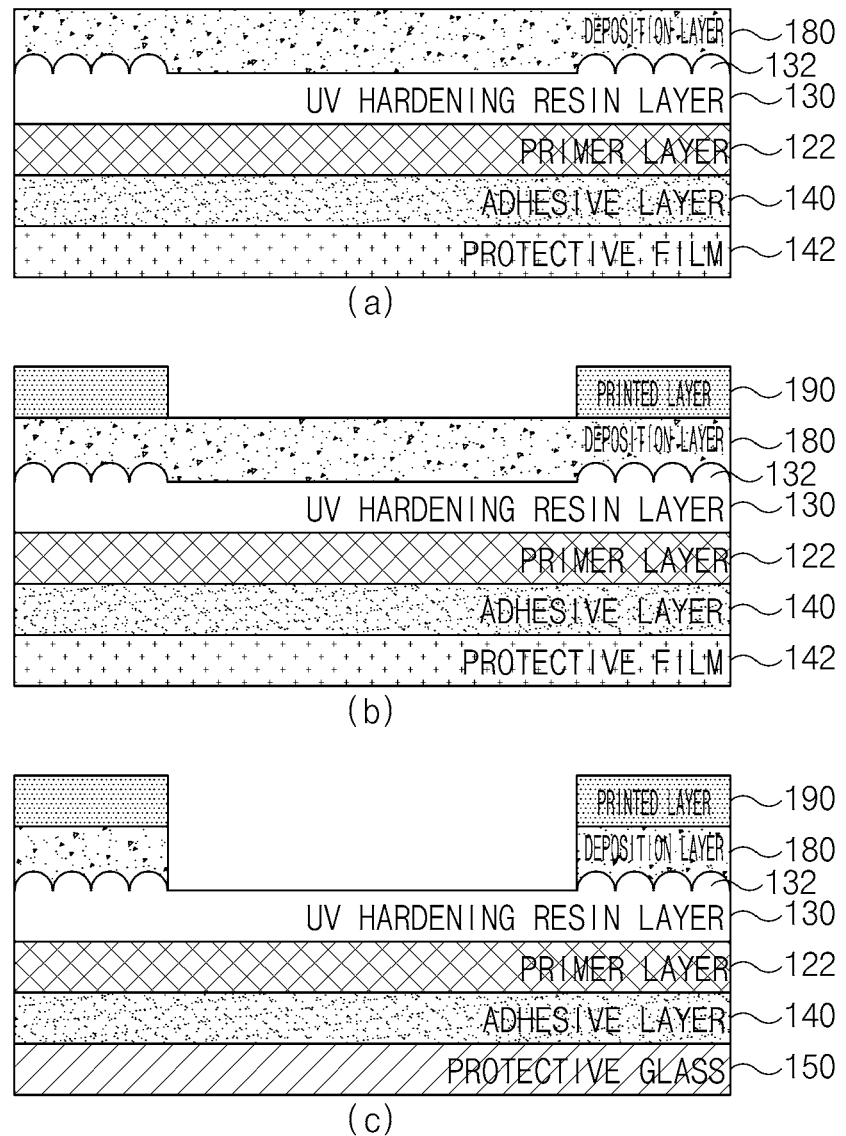
FIG. 6 is a detailed view sequentially illustrating a step (d) illustrated in FIGS. 4 and 5.

FIG. 4 is a view sequentially illustrating a manufacturing method of the window glass 100 illustrated in FIG. 2. FIG. 5 is a view sequentially illustrating a manufacturing method of the window glass 100 illustrated in FIG. 3. FIG. 6 is a detailed view sequentially illustrating an etching step (d) illustrated in FIGS. 4 and 5.

Referring to FIG. 4, the manufacturing method of the window glass 100 according to an embodiment may include a step of preparing a primer layer 122 having optical isotropy, a step of coating one surface of the primer layer 122 with a UV hardening coating solution, a pattern portion (132) forming step of forming a pattern on the UV hardening coating solution to correspond to the opaque area 102, a step of forming the UV hardening resin layer (130) by irradiating UV light to the UV hardening coating solution having the pattern formed thereon, a deposition layer (180) forming step of depositing metal or a metal compound on the pattern portion 132, a printed layer (190) forming step of printing a color on the deposition layer 180, an etching step of etching an area of the deposition layer 190 that corresponds to the transparent area 101, and a step of coupling the protective glass to the back side of the isotropic layer.

Furthermore, as illustrated in FIG. 5, the window glass manufacturing method may further include a step of forming the reinforcing layer 160 by additionally coating a UV hardening coating solution to cover the pattern portion 132 and the printed layer 190 after the etching step.

In FIGS. 4 to 6, the primer layer 122 may be referred to as the isotropic layer (120 of FIGS. 2 and 3).

The isotropic layer may be prepared as the primer layer 122 through a thermal-hardening process on the adhesive layer 140. The primer layer 122 may be formed of a composite material of a hard material and a soft material. The primer layer may be formed of a composition containing acrylic acrylate and urethane acrylate for attachment to the UV hardening resin layer 130. The composition does not contain a PET material. A protective film 142 may be formed on a surface of the adhesive layer that is opposite to the surface of the adhesive layer on which the primer layer 122 is formed.

The primer layer 122 may be formed on the adhesive layer 140 by gravure coating or air-knife coating. The primer layer 122 formed in such a way may have optical isotropy. The primer layer 122 is formed by a thermal-hardening process and is excellent in an adhesive property, as compared with when the primer layer 122 is formed by a UV-hardening process.

Thereafter, the one surface of the primer layer 122 may be coated with the UV hardening coating solution. The pattern may be formed on an area that corresponds to the opaque area 102 of the primer layer.

When UV light is irradiated after the pattern is formed, the coating solution may be hardened, and accordingly the UV hardening resin layer 130 may be formed.

Metal, a metal compound, or oxide may be deposited on the UV hardening resin layer 130, which has the pattern formed thereon, by thermal deposition. Deposition steps may be repeatedly performed for various materials, respectively. Accordingly, the opaque area 102 of the window glass 100 may form metal texture.

After the deposition layer 180 is formed, the printed layer 190 having a predetermined color may be formed. A black layer printed with a black ink may be formed after the colored printed layer 190 printed with a color ink is formed. Printing of the colored printed layer 190 may be repeatedly performed a plurality of times. Alternatively, only the black layer may be formed by performing only black ink printing without color ink printing.

After the printed layer 190 is formed, part of the deposition layer 180 of the transparent area 101 may be etched. The etching step is for ensuring visibility of the transparent area 101 by etching the opaque layer 170 corresponding to the transparent area 101. As illustrated in FIG. 6, a portion of the deposition layer 180 that corresponds to the transparent area 101 may be etched.

Referring again to FIG. 5, the reinforcing layer may be formed on the lower surfaces of the transparent layer 110 and the opaque layer 170. The reinforcing layer 160 may be formed to cover the printed layer 190 and the deposition layer 180 and may be formed to fill the space between the printed layer and the deposition layer.

The reinforcing layer may be formed of a UV hardening resin material. Likewise to the UV hardening resin layer, a liquid coating solution may be applied and may be hardened when UV light is irradiated. The reinforcing layer may prevent damage to the printed layer 190, may prevent infiltration of impurities into the transparent area 101, and may improve product reliability.

Thereafter, the protective glass 150 may be attached to the opposite surface of the adhesive layer 140. The protective glass 150 may protect the internal components of the window glass 100.

Hereinafter, a case where the window glass has physical isotropy and a case where the window glass has chemical isotropy will be described.

In various embodiments of the disclosure, the isotropic layer 120 may include a physically isotropic layer or a chemically isotropic layer.

The physically isotropic layer may refer to a layer through which a physically transferred signal, such as sound waves or vibration, uniformly passes irrespective of a transfer direction.

A sensor for sensing a physical signal may be disposed under the window glass. The sensor may receive a physical signal such as sound waves or vibration. The physical signal input from the outside may pass through the window glass and may be received by the sensor.

At this time, when the window glass has physical isotropy, the sensor may accurately sense the physical signal irrespective of the input direction of the physical signal.

The chemically isotropic layer may refer to a layer through which a chemical signal uniformly passes irrespective of a transfer direction.

A sensor for sensing a chemical signal may be disposed under the window glass. The sensor may receive the chemical signal. The chemical signal input from the outside may pass through the window glass and may be received by the sensor.

At this time, when the window glass has chemical isotropy, the sensor may accurately sense the chemical signal irrespective of the input direction of the chemical signal.

Figure 7:
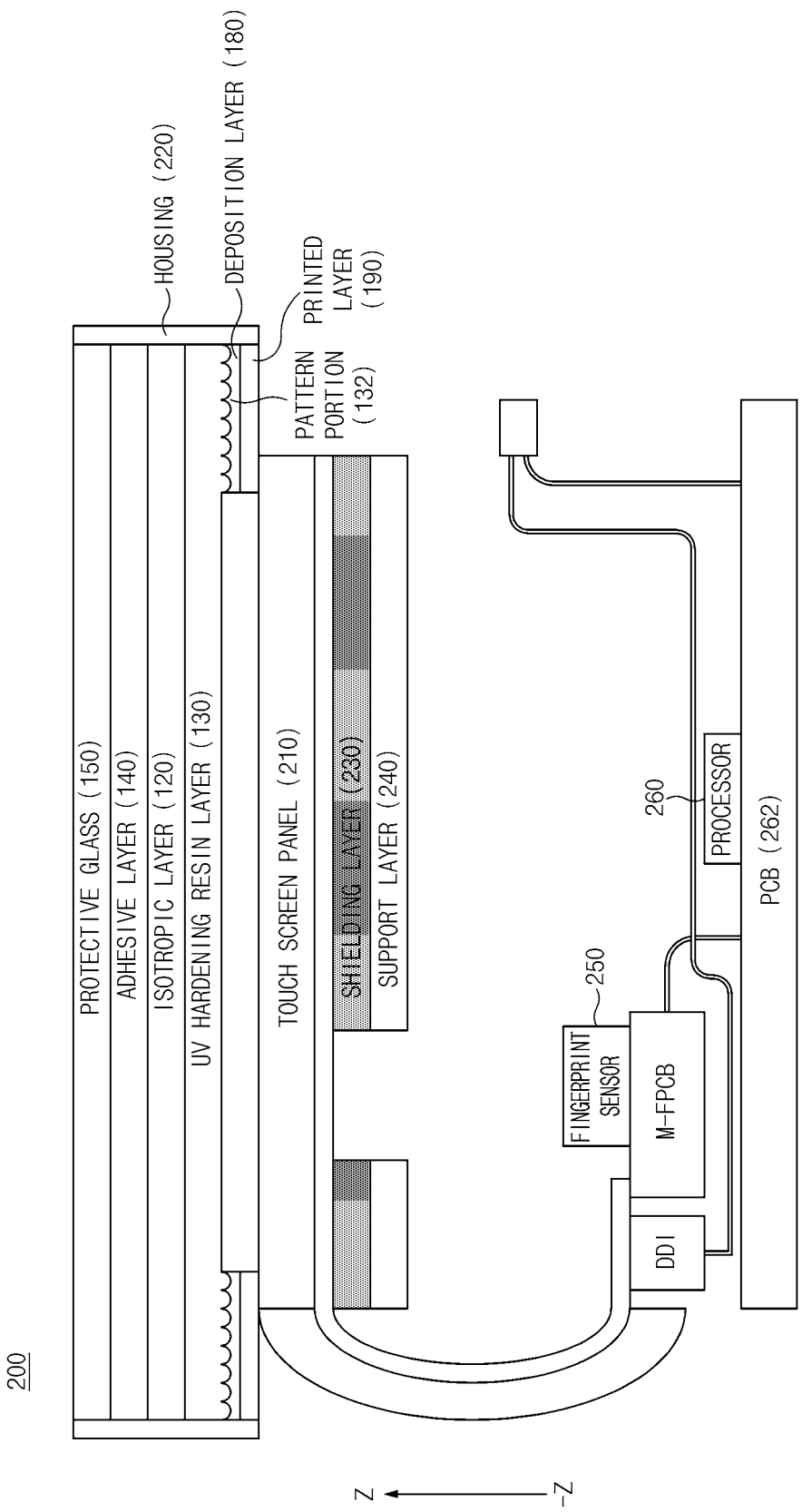
FIG. 7 is a sectional view of an electronic device according to another embodiment.

FIG. 7 is a sectional view of an electronic device 200 according to another embodiment.

Hereinafter, the electronic device 200 including the above-described window glass 100 will be described with reference to FIG. 7. The window glass 100 may have optical isotropy. As described above, the electronic device 200 may have at least one optical sensor, and the optical sensor may include a fingerprint sensor 250 that receives light passing through the window glass 100. Based on FIG. 7, in the following description, a direction in which the protective glass 150 is formed is referred to as an upper side, and a direction in which a printed circuit board (PCB) 262 is formed is referred to as a lower side.

Alternatively, the window glass 100 may have physical and/or chemical isotropy. The sensor may include a physical sensor that receives a physical signal and/or a chemical sensor that receives a chemical signal.

The electronic device 200 according to the other embodiment may include a housing, the touch screen panel 210 provided in the housing, the window glass 100 formed on the touch screen panel 210, the fingerprint sensor 250 disposed in the housing, and a processor 260 configured to control the fingerprint sensor 250.

The window glass 100 may be formed on at least a first surface of the housing, and the structure of the window glass 100 is the same as that described above. For example, the opaque area 102, which is a bezel area, may be formed on opposite sides of the window glass 100 of FIG. 7. That is, when an upper surface is viewed through the transparent layer 110, the bezel may have a unique pattern and a unique color due to the deposition layer 180 and the printed layer 190 formed on the pattern portion 132.

Although the window glass 100 is generally formed on a front surface of the electronic device 200, a partial surface extending from the front surface may be formed to be curved.

The touch screen panel 210 may be formed under the window glass 100. The touch screen panel 210 may be a display or a display device that has a touch function and may include a pixel array including a plurality of light emitting diodes. Light emitted from the pixel array may be released to the outside through the window glass 100.

The touch screen panel 210 of FIG. 7 is not limited to a thing having a touch function, and all components for displaying a screen may be included. Under the touch screen panel 210, a PI layer, a shielding layer 230 formed under the PI layer, and a support layer 240 formed under the shielding layer 230 may be formed from top to bottom.

The PI film may be disposed in the −Z direction of the touch screen panel 210. The PI film may include wiring for supplying power and/or signals to the touch screen panel 210. According to an embodiment, the PI film may be formed of a flexible material and may extend from the touch screen panel 210 to the PCB 262.

The shielding layer 230 may be disposed in the −Z direction of the touch screen panel 210. The shielding layer 230 may be formed of copper (Cu) or graphite and may interrupt electro-magnetic interference between the touch screen panel 210 and other parts.

The support layer 240 may be disposed in the −Z direction of the shielding layer 230. The support layer 240 may include at least one of a light blocking layer (e.g., an EMBO layer) and a buffer layer (e.g., a sponge layer). The support layer 240 may absorb external shock, thereby protecting other components inside the electronic device 200. For example, a recess into which the fingerprint sensor 250 is inserted may be formed in the shielding layer 230 and the support layer 240.

A display driver integrated circuit (IC) (DDI) may be disposed on a partial area of the PI film. The display driver IC may control the pixel array through the PI film. For example, the display driver IC may allow pixels to emit light, or may adjust the brightness of the pixels.

The processor 260 (e.g., an application processor) may be formed on the PCB 262 and may be formed under the support layer 240.

Light emitted from the touch screen panel 210 may pass through the window glass 100 and may be reflected by a user's fingerprint. The reflected light may pass through the window glass 100 again and may be received by the fingerprint sensor 250. For example, the processor 260 may be configured to cause the fingerprint sensor 250 to receive the reflected light and may determine the user's fingerprint through the reflected light. In another example, the processor may be configured to receive the physical and/or chemical signal sensed by the physical sensor and/or the chemical sensor.

Figure 8:
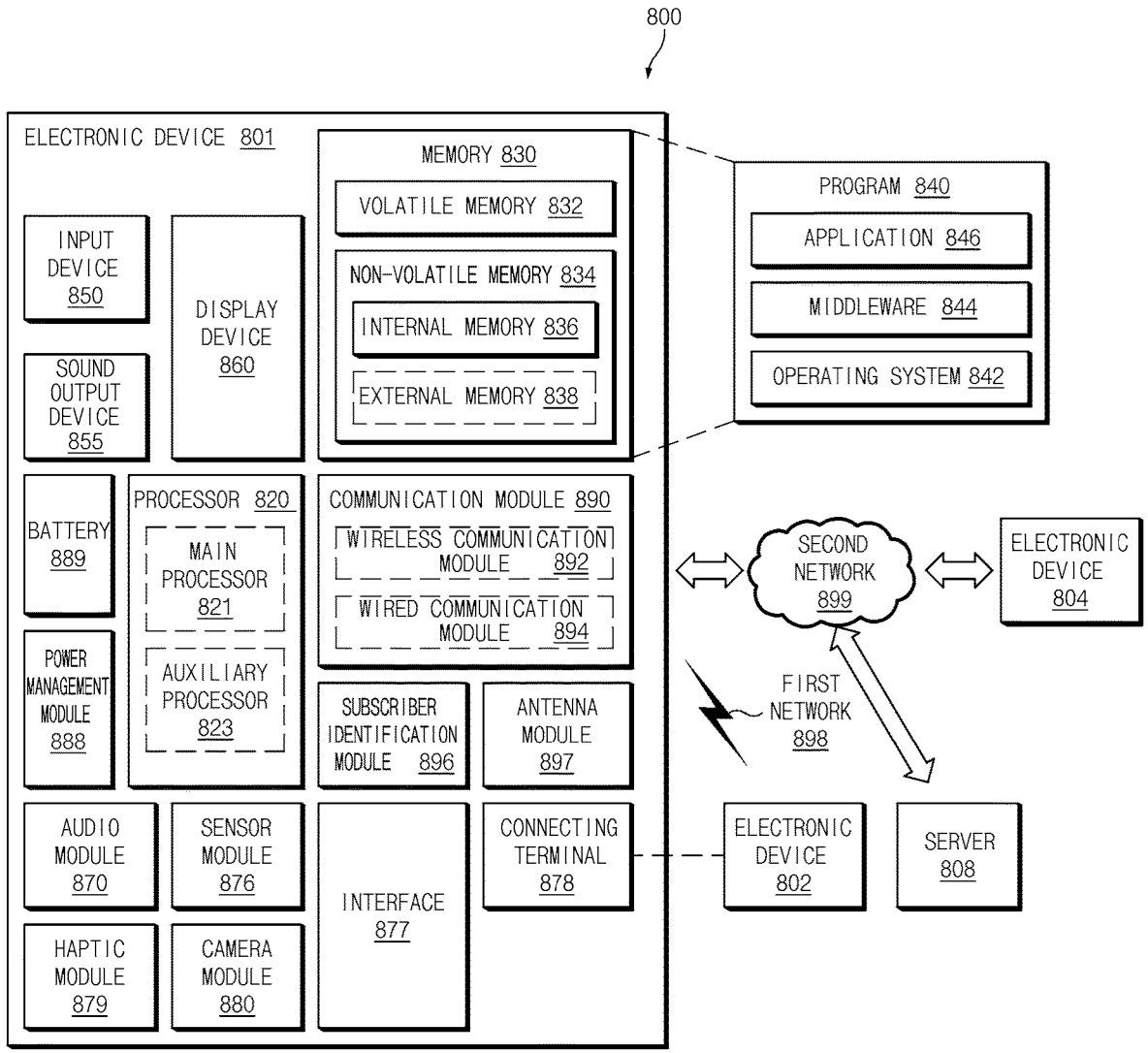
FIG. 8 is a block diagram of an electronic device in a network environment according to various embodiments.

FIG. 8 is a block diagram illustrating an electronic device 801 in a network environment 800 according to various embodiments. Referring to FIG. 8, the electronic device 801 in the network environment 800 may communicate with an electronic device 802 via a first network 898 (e.g., a short-range wireless communication network), or an electronic device 804 or a server 808 via a second network 899 (e.g., a long-range wireless communication network). According to an embodiment, the electronic device 801 may communicate with the electronic device 804 via the server 808. According to an embodiment, the electronic device 801 may include a processor 820, memory 830, an input device 850, a sound output device 855, a display device 860, an audio module 870, a sensor module 876, an interface 877, a haptic module 879, a camera module 880, a power management module 888, a battery 889, a communication module 890, a subscriber identification module (SIM) 896, or an antenna module 897. In some embodiments, at least one (e.g., the display device 860 or the camera module 880) of the components may be omitted from the electronic device 801, or one or more other components may be added in the electronic device 801. In some embodiments, some of the components may be implemented as single integrated circuitry. For example, the sensor module 876 (e.g., a fingerprint sensor, an iris sensor, or an illuminance sensor) may be implemented as embedded in the display device 860 (e.g., a display).

The processor 820 may execute, for example, software (e.g., a program 840) to control at least one other component (e.g., a hardware or software component) of the electronic device 801 coupled with the processor 820, and may perform various data processing or computation. According to one embodiment, as at least part of the data processing or computation, the processor 820 may load a command or data received from another component (e.g., the sensor module 876 or the communication module 890) in volatile memory 832, process the command or the data stored in the volatile memory 832, and store resulting data in non-volatile memory 834. According to an embodiment, the processor 820 may include a main processor 821 (e.g., a central processing unit (CPU) or an application processor (AP)), and an auxiliary processor 823 (e.g., a graphics processing unit (GPU), an image signal processor (ISP), a sensor hub processor, or a communication processor (CP)) that is operable independently from, or in conjunction with, the main processor 821. Additionally or alternatively, the auxiliary processor 823 may be adapted to consume less power than the main processor 821, or to be specific to a specified function. The auxiliary processor 823 may be implemented as separate from, or as part of the main processor 821.

The auxiliary processor 823 may control at least some of functions or states related to at least one component (e.g., the display device 860, the sensor module 876, or the communication module 890) among the components of the electronic device 801, instead of the main processor 821 while the main processor 821 is in an inactive (e.g., sleep) state, or together with the main processor 821 while the main processor 821 is in an active state (e.g., executing an application). According to an embodiment, the auxiliary processor 823 (e.g., an image signal processor or a communication processor) may be implemented as part of another component (e.g., the camera module 880 or the communication module 890) functionally related to the auxiliary processor 823.

The memory 830 may store various data used by at least one component (e.g., the processor 820 or the sensor module 876) of the electronic device 801. The various data may include, for example, software (e.g., the program 840) and input data or output data for a command related thererto. The memory 830 may include the volatile memory 832 or the non-volatile memory 834.

The program 840 may be stored in the memory 830 as software, and may include, for example, an operating system (OS) 842, middleware 844, or an application 846.

The input device 850 may receive a command or data to be used by other component (e.g., the processor 820) of the electronic device 801, from the outside (e.g., a user) of the electronic device 801. The input device 850 may include, for example, a microphone, a mouse, a keyboard, or a digital pen (e.g., a stylus pen).

The sound output device 855 may output sound signals to the outside of the electronic device 801. The sound output device 855 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 860 may visually provide information to the outside (e.g., a user) of the electronic device 801. The display device 860 may include, for example, a display, a hologram device, or a projector and control circuitry to control a corresponding one of the display, hologram device, and projector. According to an embodiment, the display device 860 may include touch circuitry adapted to detect a touch, or sensor circuitry (e.g., a pressure sensor) adapted to measure the intensity of force incurred by the touch.

The audio module 870 may convert a sound into an electrical signal and vice versa. According to an embodiment, the audio module 870 may obtain the sound via the input device 850, or output the sound via the sound output device 855 or a headphone of an external electronic device (e.g., an electronic device 802) directly (e.g., wiredly) or wirelessly coupled with the electronic device 801.

The sensor module 876 may detect an operational state (e.g., power or temperature) of the electronic device 801 or an environmental state (e.g., a state of a user) external to the electronic device 801, and then generate an electrical signal or data value corresponding to the detected state. According to an embodiment, the sensor module 876 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 877 may support one or more specified protocols to be used for the electronic device 801 to be coupled with the external electronic device (e.g., the electronic device 802) directly (e.g., wiredly) or wirelessly. According to an embodiment, the interface 877 may include, for example, a high definition multimedia interface (HDMI), a universal serial bus (USB) interface, a secure digital (SD) card interface, or an audio interface.

A connecting terminal 878 may include a connector via which the electronic device 801 may be physically connected with the external electronic device (e.g., the electronic device 802). According to an embodiment, the connecting terminal 878 may include, for example, a HDMI connector, a USB connector, a SD card connector, or an audio connector (e.g., a headphone connector).

The haptic module 879 may convert an electrical signal into a mechanical stimulus (e.g., a vibration or a movement) or electrical stimulus which may be recognized by a user via his tactile sensation or kinesthetic sensation. According to an embodiment, the haptic module 879 may include, for example, a motor, a piezoelectric element, or an electric stimulator.

The camera module 880 may capture a still image or moving images. According to an embodiment, the camera module 880 may include one or more lenses, image sensors, image signal processors, or flashes.

The power management module 888 may manage power supplied to the electronic device 801. According to one embodiment, the power management module 888 may be implemented as at least part of, for example, a power management integrated circuit (PMIC).

The battery 889 may supply power to at least one component of the electronic device 801. According to an embodiment, the battery 889 may include, for example, a primary cell which is not rechargeable, a secondary cell which is rechargeable, or a fuel cell.

The communication module 890 may support establishing a direct (e.g., wired) communication channel or a wireless communication channel between the electronic device 801 and the external electronic device (e.g., the electronic device 802, the electronic device 804, or the server 808) and performing communication via the established communication channel. The communication module 890 may include one or more communication processors that are operable independently from the processor 820 (e.g., the application processor (AP)) and supports a direct (e.g., wired) communication or a wireless communication. According to an embodiment, the communication module 890 may include a wireless communication module 892 (e.g., a cellular communication module, a short-range wireless communication module, or a global navigation satellite system (GNSS) communication module) or a wired communication module 894 (e.g., a local area network (LAN) communication module or a power line communication (PLC) module). A corresponding one of these communication modules may communicate with the external electronic device via the first network 898 (e.g., a short-range communication network, such as Bluetooth™ wireless-fidelity (Wi-Fi) direct, or infrared data association (IrDA)) or the second network 899 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 892 may identify and authenticate the electronic device 801 in a communication network, such as the first network 898 or the second network 899, using subscriber information (e.g., international mobile subscriber identity (IMSI)) stored in the subscriber identification module 896.

The antenna module 897 may transmit or receive a signal or power to or from the outside (e.g., the external electronic device) of the electronic device 801. According to an embodiment, the antenna module 897 may include an antenna including a radiating element composed of a conductive material or a conductive pattern formed in or on a substrate (e.g., a PCB). According to an embodiment, the antenna module 897 may include a plurality of antennas. In such a case, at least one antenna appropriate for a communication scheme used in the communication network, such as the first network 898 or the second network 899, may be selected, for example, by the communication module 890 (e.g., the wireless communication module 892) from the plurality of antennas. The signal or the power may then be transmitted or received between the communication module 890 and the external electronic device via the selected at least one antenna. According to an embodiment, another component (e.g., a radio frequency integrated circuit (RFIC)) other than the radiating element may be additionally formed as part of the antenna module 897.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 801 and the external electronic device 804 via the server 808 coupled with the second network 899. Each of the electronic devices 802 and 804 may be a device of a same type as, or a different type, from the electronic device 801. According to an embodiment, all or some of operations to be executed at the electronic device 801 may be executed at one or more of the external electronic devices 802, 804, or 808. For example, if the electronic device 801 should perform a function or a service automatically, or in response to a request from a user or another device, the electronic device 801, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 801. The electronic device 801 may provide the outcome, with or without further processing of the outcome, as at least part of a reply to the request. To that end, a cloud computing, distributed computing, or client-server computing technology may be used, for example.

Figure 9:
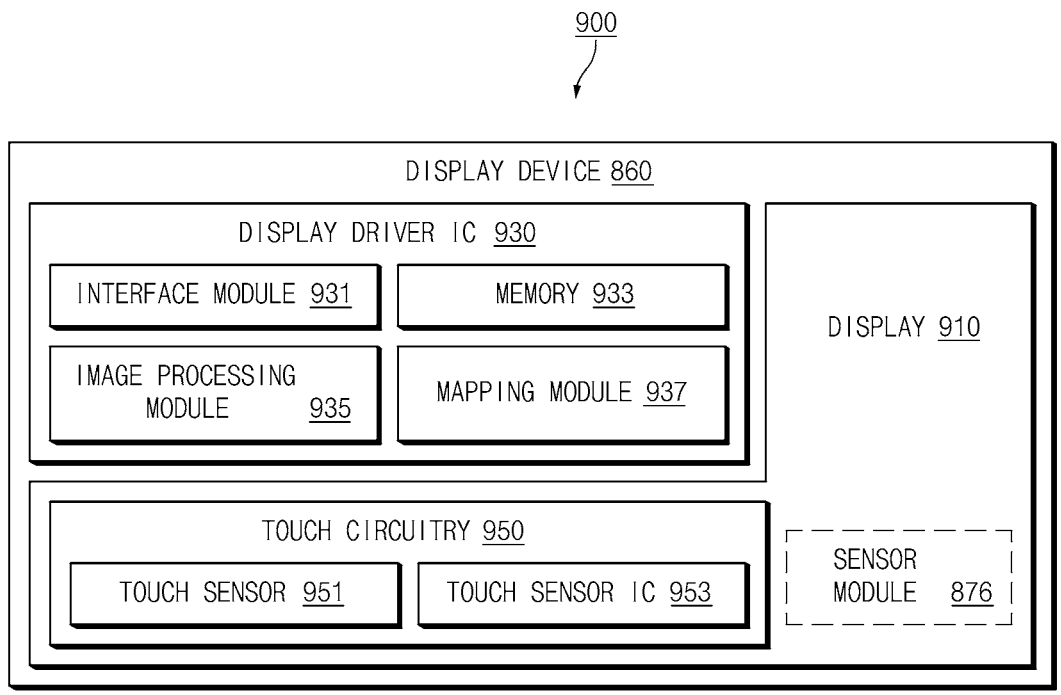
FIG. 9 is a block diagram of a display device according to various embodiments.

FIG. 9 is a block diagram 900 illustrating the display device 860 according to various embodiments. Referring to FIG. 9, the display device 860 may include a display 910 and a display driver integrated circuit (DDI) 930 to control the display 910. The DDI 930 may include an interface module 931, memory 933 (e.g., buffer memory), an image processing module 935, or a mapping module 937. The DDI 930 may receive image information that contains image data or an image control signal corresponding to a command to control the image data from another component of the electronic device 801 via the interface module 931. For example, according to an embodiment, the image information may be received from the processor 820 (e.g., the main processor 821 (e.g., an application processor)) or the auxiliary processor 823 (e.g., a graphics processing unit) operated independently from the function of the main processor 821. The DDI 930 may communicate, for example, with touch circuitry 950 or the sensor module 876 via the interface module 931. The DDI 930 may also store at least part of the received image information in the memory 933, for example, on a frame by frame basis. The image processing module 935 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 910. The mapping module 937 may generate a voltage value or a current value corresponding to the image data pre-processed or post-processed by the image processing module 935. According to an embodiment, the generating of the voltage value or current value may be performed, for example, based at least in part on one or more attributes of the pixels (e.g., an array, such as an RGB stripe or a pentile structure, of the pixels, or the size of each subpixel). At least some pixels of the display 910 may be driven, for example, based at least in part on the voltage value or the current value such that visual information (e.g., a text, an image, or an icon) corresponding to the image data may be displayed via the display 910.

According to an embodiment, the display device 860 may further include the touch circuitry 950. The touch circuitry 950 may include a touch sensor 951 and a touch sensor IC 953 to control the touch sensor 951. The touch sensor IC 953 may control the touch sensor 951 to sense a touch input or a hovering input with respect to a certain position on the display 910. To achieve this, for example, the touch sensor 951 may detect (e.g., measure) a change in a signal (e.g., a voltage, a quantity of light, a resistance, or a quantity of one or more electric charges) corresponding to the certain position on the display 910. The touch circuitry 950 may provide input information (e.g., a position, an area, a pressure, or a time) indicative of the touch input or the hovering input detected via the touch sensor 951 to the processor 820. According to an embodiment, at least part (e.g., the touch sensor IC 953) of the touch circuitry 950 may be formed as part of the display 910 or the DDI 930, or as part of another component (e.g., the auxiliary processor 823) disposed outside the display device 860.

According to an embodiment, the display device 860 may further include at least one sensor (e.g., a fingerprint sensor, an iris sensor, a pressure sensor, or an illuminance sensor) of the sensor module 876 or a control circuit for the at least one sensor. In such a case, the at least one sensor or the control circuit for the at least one sensor may be embedded in one portion of a component (e.g., the display 910, the DDI 930, or the touch circuitry 950)) of the display device 860. For example, when the sensor module 876 embedded in the display device 860 includes a biometric sensor (e.g., a fingerprint sensor), the biometric sensor may obtain biometric information (e.g., a fingerprint image) corresponding to a touch input received via a portion of the display 910. As another example, when the sensor module 876 embedded in the display device 860 includes a pressure sensor, the pressure sensor may obtain pressure information corresponding to a touch input received via a partial or whole area of the display 910. According to an embodiment, the touch sensor 951 or the sensor module 876 may be disposed between pixels in a pixel layer of the display 910, or over or under the pixel layer.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 840) including one or more instructions that are stored in a storage medium (e.g., internal memory 836 or external memory 838) that is readable by a machine (e.g., the electronic device 801). For example, a processor (e.g., the processor 820) of the machine (e.g., the electronic device 801) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. A window glass, wherein the window glass is divided into a transparent area and an opaque area formed to surround at least part of the transparent area,
wherein the window glass comprises:
a transparent layer; and
an opaque layer configured to form the opaque area by being stacked on a partial area of the transparent layer to correspond to the opaque area,
wherein the transparent layer includes:
a protective glass configured to form a first surface of the window glass;
a first transparent layer formed of a material that is hardened by irradiation of UV light, the first transparent layer including a pattern portion having a pattern formed on an area corresponding to the opaque area; and
a second transparent layer formed of an optically isotropic material and formed between the protective glass and the first transparent layer,
wherein the opaque layer is formed on the pattern portion, and
wherein part of the first transparent layer and the opaque layer form a second surface of the window glass.

2. The window glass of claim 1, wherein the opaque layer includes a first opaque layer formed on the pattern portion and a second opaque layer formed on the first opaque layer.

3. The window glass of claim 2,
wherein the first opaque layer includes at least one metal layer, and
wherein the metal layer contains metal and/or a metal compound.

4. The window glass of claim 3, wherein the metal compound includes metal oxide.

5. The window glass of claim 2,
wherein the second opaque layer includes at least one printed layer, and
wherein the at least one printed layer includes a printed layer formed with at least one color.

6. The window glass of claim 2, wherein the second opaque layer is formed of a polyester resin or an epoxy resin.

7. The window glass of claim 1, further comprising:
an adhesive layer formed between the protective glass and the second transparent layer.

8. The window glass of claim 7, wherein the adhesive layer is formed of one of an optical clear adhesive (OCA) or a pressure sensitive adhesive (PSA).

9. The window glass of claim 1,
wherein the second transparent layer includes a primer layer having optical isotropy, the primer layer being formed of a thermal-hardening composition capable of being hardened by heat, and
wherein the thermal-hardening composition contains acrylic acrylate and/or urethane acrylate.

10. The window glass of claim 1, wherein the second transparent layer includes a physically isotropic layer having physical isotropy and/or a chemically isotropic layer having chemical isotropy.

11. The window glass of claim 1,
wherein first transparent layer comprises a liquid coating which is hardened by irradiation of UV light, and
wherein the pattern portion is formed by transferring a predetermined pattern to the liquid coating prior to the irradiation of UV light.

12. The window glass of claim 1, wherein the pattern portion is formed by a mold.

13. An electronic device comprising:
a housing;
a window glass formed on at least a first surface of the housing;
a touch screen panel disposed in the housing and disposed under the window glass,
a fingerprint sensor disposed in the housing and disposed in a position corresponding to a partial area of the touch screen panel; and
at least one processor disposed in the housing,
wherein the window glass includes:
- a transparent layer, wherein the transparent layer includes a protective glass configured to form a first surface of the window glass, a first transparent layer formed of a material that is hardened by irradiation of UV light, and a second transparent layer formed of an optically isotropic material and formed between the protective glass and the first transparent layer; and
- an opaque layer formed on a partial area of the first transparent layer, wherein a remaining area of the first transparent layer and the opaque layer form a second surface of the window glass, and
wherein the at least one processor is configured to control the touch screen panel and the fingerprint sensor such that light emitted from the touch screen panel passes through the second transparent layer of the window glass and is collected through the fingerprint sensor.

14. The electronic device of claim 13,
wherein the window glass is formed on one surface of the touch screen panel, and a shielding layer configured to block electromagnetic waves and a support layer for absorbing shock are formed on an opposite surface of the touch screen panel, and
wherein a recess into which the fingerprint sensor is inserted is formed in the shielding layer and the support layer.

15. The electronic device of claim 13, wherein the touch screen panel includes an organic light emitting diode (OLED) pixel array having a plurality of organic light emitting diodes formed therein.

16. The electronic device of claim 13, wherein, the touch screen panel is formed to be transparent to allow light to pass, such that reflective light reflected by a fingerprint passes through the touch screen panel and is collected through the fingerprint sensor.

17. The electronic device of claim 13, wherein the second transparent layer is formed of a composition containing acrylic acrylate and urethane acrylate.

* * * * *